United States Patent [19]

Sarkhel et al.

[11] Patent Number: 5,730,932
[45] Date of Patent: Mar. 24, 1998

[54] LEAD-FREE, TIN-BASED MULTI-COMPONENT SOLDER ALLOYS

[75] Inventors: Amit K. Sarkhel, Endicott; Charles Gerard Woychik, Vestal, both of N.Y.

[73] Assignee: International Business Machines Corporation, Armonk, N.Y.

[21] Appl. No.: 612,614

[22] Filed: Mar. 6, 1996

[51] Int. Cl.⁶ ............................................. C22C 5/04
[52] U.S. Cl. .................. 420/562; 228/180.1; 228/180.21; 437/211
[58] Field of Search ........................ 420/557, 562; 228/179.1, 180.1, 180.21; 437/209, 211

[56] References Cited

U.S. PATENT DOCUMENTS

| | | | |
|---|---|---|---|
| 4,170,472 | 10/1979 | Olsen et al. | 228/263 |
| 4,806,309 | 2/1989 | Tulman | 420/562 |
| 5,229,070 | 7/1993 | Melton et al. | 420/557 |
| 5,256,370 | 10/1993 | Slattery et al. | 420/557 |
| 5,328,660 | 7/1994 | Gonya et al. | 420/562 |
| 5,344,607 | 9/1994 | Gonya et al. | 420/562 |
| 5,538,686 | 7/1996 | Chen et al. | 420/562 |

FOREIGN PATENT DOCUMENTS 363740  4/1990  European Pat. Off. ............... 420/562

*Primary Examiner*—Sikyin Ip
*Attorney, Agent, or Firm*—Calfee, Halter & Griswold LLP

[57] ABSTRACT

The present invention provides a solder alloy having from about 80–81% tin, from about 2–4% silver, from about 5–6% indium, and from about 10–12% bismuth by weight, and microelectric circuits soldered by this alloy.

17 Claims, 1 Drawing Sheet

LEAD-FREE, TIN-BASED MULTI-COMPONENT SOLDER ALLOYS

FIELD OF THE INVENTION

The present invention relates to lead-free, low toxicity solder alloys that are particularly useful in microelectronic applications.

BACKGROUND OF THE INVENTION

Solders are used in low temperature, usually reversible, metallurgical joining processes. Low temperature solders with reversibility are especially important in electronic applications. The low temperature is required since many materials are damaged by even moderately high temperatures. The reversibility is required since reworking of products is often necessary. Low temperature soldering is extremely well suited for this.

Solder joining is a wetting process followed by a chemical reaction. Molten solder wets the substrate selectively, the selective wettability of the solder allowing molten solder to be confined to metallic pads and not to solder mask materials. This is especially important in flip chip bonding and surface mount attachment of components such as quad flat packs, and ball grid array modules.

The soldering process takes place virtually as quickly as the wetting process once the solder has melted. For example, with rapid heating, soldering can take place in just a few seconds. This makes soldering particularly desirable for automated, high-speed, high through-put processes.

Wettability is not only a function of the solder material, but is also a function of the materials to be joined by the solder, such as copper, nickel, gold and palladium, as well as those rich in one or more of these metals which are particularly amenable to soldering.

Chemical reaction following wetting is between the liquid solder and the materials being joined, which forms intermetallic phases at the interfaces. The intermetallic phases formed by solders in electronic packaging are stoichiometric compounds, typically binary compounds and typically containing tin if tin is present in the solder alloy. If one of the metals to be joined is copper and the solder alloy is rich in tin, the intermetallic compound formed during soldering is Cu-Sn. Cu-Sn binaries include $Cu_3Sn$ and $CU_6Sn_5$, although other intermetallics may be formed.

Solder alloys are characterized by the melting temperature being a function of composition. Thus, while a pure metal is characterized by a single invariant melting temperature, the freezing and melting points of alloys are complex. The freezing point of an alloy is determined by the liquidus line, wherein only a liquid phase exists above the liquidus line. The melting point of an alloy is determined by the solidus line, wherein only a solid phase or phases can exist below the solidus line. In the region between the solidus and liquidus lines, solid and liquid phases generally co-exist. Many soldering alloys are eutectics; i.e., they are characterized by a eutectic point. The eutectic point is where the liquidus and solidus lines meet, and thus there is a single melting temperature representing both the liquidus and solidus temperature. A change in concentration of the element in either direction from the eutectic composition results in an increase in the liquidus temperature, and also generally in a separation between the liquidus and solidus lines, with liquid and solid phases therebetween as indicated above. The composition and quench rate also determine the microstructure and resulting mechanical properties of a solder joint. Thus, it is necessary to both carefully choose the solder composition and to control the thermal exposure and thermal excursions of the solder joint.

One very common type of solder composition used in electronics fabrication is the tin/lead alloys. These alloys are capable of forming electrically-conductive, thermally stable, non-brittle intermetallics with the material being joined. One particular alloy that is well known is a eutectic tin/lead composition which contains about 63% tin and 37% lead. This particular alloy, being a eutectic, has a melting point of about 183° C. (compared to Sn which has a melting point of 232° C. and Pb which has a melting point of 327° C.). This low melting point, plus the workability of the lead/tin alloys and the adhesion of the copper/tin intermetallics over a wide temperature range, and the availability of equipment and related materials for the process has made the tin/lead alloys extremely desirable. This relatively low temperature is non-damaging to most electronic components and other materials such as organic substrates, and the process is reversible.

Another important characteristic of this material is the softness or plasticity of these lead-base solders. This softness or plasticity allows the solder to accommodate the mismatch in coefficients of thermal expansion of bonded structures. For example, the mismatch in coefficients of thermal expansion between a ceramic dielectric and a polymeric dielectric, or between a semiconductor chip and a ceramic or polymeric chip carrier or substrate, can readily be accommodated.

However, one major drawback to the tin/lead alloys is that lead is toxic and has a relatively high vapor pressure. Thus, while in many cases there is not a large amount of lead present, nevertheless the accumulation of lead, even in small amounts, can be unacceptable and thus the use of lead is becoming more and more disfavored, with a replacement for the lead being required.

U.S. Pat. No. 5,256,370 to Slattery, et al. suggests certain solder alloys containing Sn, Ag, and In. Also, U.S. Pat. No. 5,328,660 to Gonya, et al., suggests a quaternary solder alloy of 78.4% Sn, 2% Ag, 9.8% Bi, and 9.8% In. U.S. Pat. Nos. 4,998,342 and 4,761,881 suggest pin-in-hole and surface mount assemblies using wave soldering and solder paste. These patents are incorporated herein in whole by reference.

OBJECTS OF THE INVENTION

It is a primary object of this invention to provide a lead-free solder. It is a further object of this invention to provide a lead-free solder that wets and forms a chemically and thermally stable bond, with the bonding materials commonly used in electronic fabrication and which has properties very close to lead/tin alloys, particularly 63% tin and 37% lead alloy.

SUMMARY OF THE INVENTION

According to the present invention, a lead-free solder is provided which contains a major portion of tin and effective amounts of silver, bismuth and indium, and which has a liquidus temperature which closely approximates the temperature of eutectic tin/lead solder and is used to join microelectronic components.

DESCRIPTION OF THE PREFERRED EMBODIMENT(S)

According to the present invention, the above objects are achieved, and the shortcomings of the prior art are overcome by a multicomponent solder alloy containing from about 80–81% tin, from about 2–4% silver, from about 5–6% indium, and from about 10–12% bismuth. (All percentages herein are weight percentages unless otherwise noted.) Solder alloys comprised of the above components in the ranges given will have a liquidus temperature in the range of about 180° C. to about 190° C., and solidus temperature in the range of about 150° C. to about 160° C. (As indicated above, the tin/lead eutectic, i.e., 63% tin, 37% lead, has a melting point of about 183° C., which is within the range of the liquidus temperature of about 180° C. to 190° C. of the present alloy.) Two preferred compositions of alloys according to the present invention are shown in Table I below:

TABLE I

| Sn | Ag | In | Bi | MP (°C.) (Solidus/ Liquidus) |
|---|---|---|---|---|
| 80.0 | 3.3 | 5.5 | 11.2 | 160/186 |
| 80.8 | 2.5 | 5.5 | 11.2 | 152/184 |
| 63 Sn/37 Pb. (Control) | | | | 183 eutectic |

This table also shows the comparable values for the tin/lead eutectic alloy.

In the alloy of the invention, both the Bi and In operate to lower the liquidus temperature. If indium alone were used, about 20% or more of indium would be required to achieve such a low liquidus temperature. However, such high levels of indium are not desired for several reasons. One reason is that indium is extremely expensive. Moreover, from a technological standpoint, indium is susceptible to corrosion when used with certain fluxes and aqueous solutions. Since solders are generally used in conjunction with fluxes, as well as in other soldering processes such as wave soldering, it is desirable to keep the amount of indium to a minimum, while still achieving the other desired properties of the solder so as to maintain process compatibility with existing processes using Pb/Sn solders.

Figure 1:
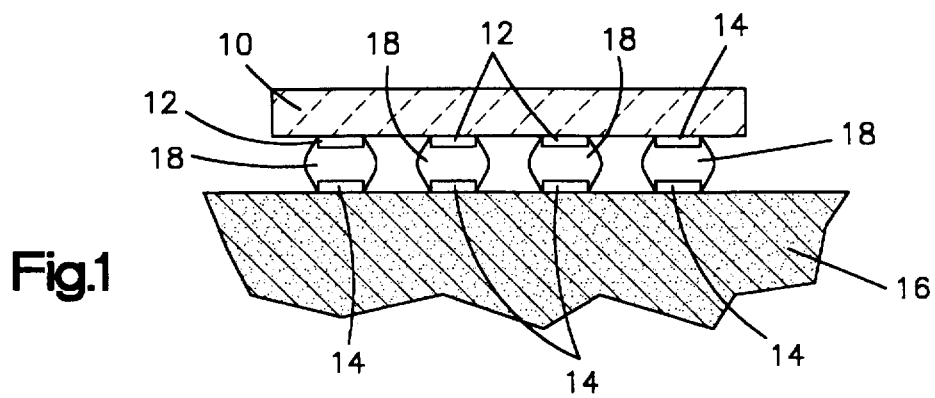
FIG. 1 is a schematic showing the joining by "flip chip" bonding of an integrated circuit chip to a substrate using a solder composition according to this invention.

The solder of the present invention may be used in the same manner as the tin/lead solder is currently used in microelectronic applications. FIG. 1 shows the use of the solder of the present invention for "flip chip bonding". An IC chip 10 having contact pads 12 thereon is shown bonded to bonding pads 14 on a dielectric substrate 16 by solder connection 18. The substrate can be a chip carrier or a planar board, and these substrates can be formed of ceramic or organic materials such as glass filled epoxies or polyimides or flexible laminates of patterned copper foil and dielectric polymeric films. The solder alloy is deposited on the pads 12 and/or 14, the chip is placed on the carrier, and the solder is melted to form the connections, and then cooled to solidify.

During reflow, the assembly is heated to cause the solder alloy to wet and bond to the electrical contacts of the circuitized substrate. Heating may be by vapor phase reflow, laser reflow, oven melting, or by any other suitable means of heating to above the liquidus temperature. Other types of connections can be made between various components in microelectronics.

The resulting microelectric circuit package of the invention in FIG. 1 is an integrated circuit chip module with a circuitized chip carrier, i.e., a substrate, a semiconductor integrated circuit chip, and a tin/silver/bismuth/indium alloy solder bond electrically interconnected between the circuitized chip carrier and the semiconductor integrated circuit chip.

Moreover, the process is reversible in that to "desolder", the soldered board is heated to above the liquidus temperature, and the soldered components separated. This allows for replacement of any defective parts or connections.

Figure 2:
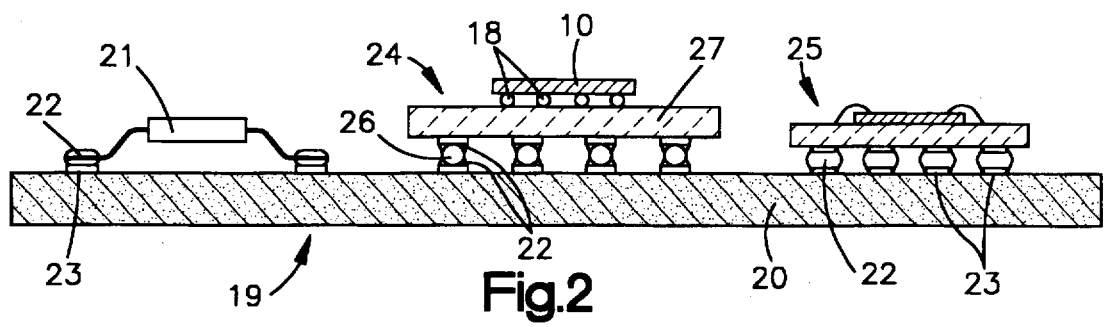
FIG. 2 is a schematic of a circuit board showing surface mount components attached to a circuit board by reflowing solder paste.

FIG. 2 shows a circuit board assembly 19 of the invention which includes a card 20 which may be any known printed circuit board substrate, and surface mount components such as a gull-wing or J-leaded component 21 which may be a quad flat pack, dual in-line package, small outline integrated circuit package or other well-known surface mount component. The component is attached by applying, preferably by screening, solder paste on copper pads 23, placing the leads of the component on the pads and reflowing the solder in an oven at a reflow temperature 20°–30° above the liquidus temperature.

The solder paste is composed of a flux material and a vehicle comprised of various organic materials to control the properties such as the rheology of the paste with the solder particles dispersed therein. The flux and organic vehicles are selected for various different applications as is well known in the art. Typically, the metal solder particles will constitute about 90% by weight of the solder paste.

The solder paste reflows to produce a solder joint 22 of an alloy containing Sn, Ag, Bi and less than 8% In, with a liquidus temperature less than about 210° C. More preferably the paste contains alloy particles of 80–81% Sn, 2–4% Ag, 5–6% In and 10–12% Bi by weight with a liquidus temperature less than 190° C., but variations in composition and measurement, and further experimentation may allow the preferred alloys to be modified by up to 1–2%.

In a similar manner, ball grid array modules 24 and 25 of the invention may be attached to the card by applying, preferably by screening, solder paste of the invention onto metal pads or onto the balls, placing the module with balls on the pads and reflowing. Chip carrier 24 includes spherical preforms or balls 26 with solidus temperature significantly above the reflow temperature of the solder paste. The balls may be preattached to the underside of the chip carrier substrate 27 by welding or more preferably by using the quaternary solder of the invention. The flip chip on the top of the module 24 may be connected as previously described with reference to FIG. 1. Module 25 of FIG. 2 may include solder bumps of the solder of the invention and/or paste of the invention may be screened on an array of pads 23 and connected by reflowing as described above to form the solder joints 22. Of course the card is then cooled to solidify the joints.

Figure 3:
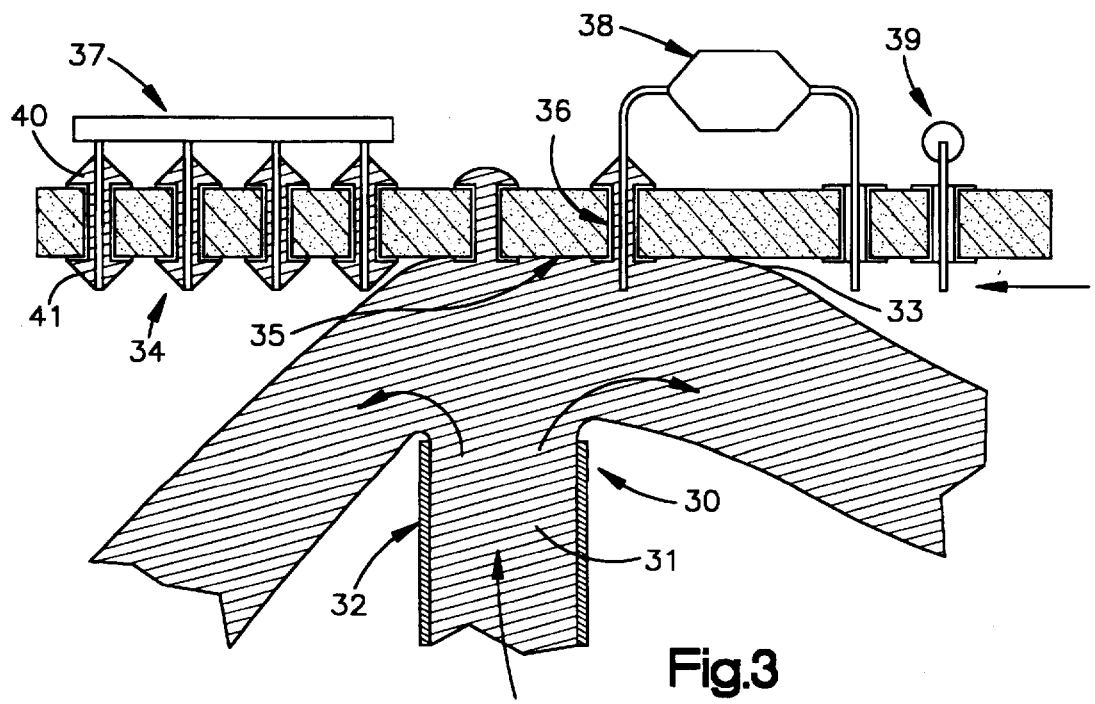
FIG. 3 is a schematic of a circuit board showing pin-in-hole components attached by wave soldering.

FIG. 3 shows a wave solder machine 30 where molten solder 31 of the invention is pumped up through nozzle 32 to form an elongate wave 33 across which a circuit board assembly 34 is moved. The wave contacts across the bottom surface 35 of the assembly and the solder flows into holes 36 which are plated with metal such as copper to which the solder wets in order to provide capillary action which draws the solder up into the holes. The pins of pin-in-hole components such as pin grid array chip carrier 37 and dual in-line package 38 and discrete components 39 such as resistor and capacitors, are inserted into the holes. Top joints 40 and bottom joints 41 are formed of the solder of the invention. As is conventional, the circuit board is moved across the wave with the bottom of the circuit board in contact with the wave filling the plated through holes. The circuit board is cooled to form solid solder joints.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A solder alloy consisting essentially of from about 80–81% tin, from about 2–4% silver, from about 5–6% indium and from about 10–12% bismuth by weight.

2. The solder composition of claim 1 wherein there is about 80.0% tin, about 3.3% silver, about 5.5% indium and about 11.2% bismuth.

3. The solder composition of claim 1 wherein there is about 80.8% tin, about 2.5% silver, about 5.5% indium and about 11.2% bismuth.

4. A microelectric structure comprising a first microelectric component bonded to a second microelectronic component by a solder alloy consisting essentially of about 80–81% tin, about 2–4% silver, about 5–6% indium, and from about 10–12% bismuth by weight.

5. The structure of claim 4 wherein there is about 80.0% tin, about 3.3% silver, about 5.5% indium and about 11.2% bismuth.

6. The structure of claim 4 wherein there is about 80.8% tin, about 2.5% silver, about 5.5% indium and about 11.2% bismuth.

7. The structure of claim 4 wherein said first component is an IC chip.

8. The structure of claim 7 wherein the second component is a chip carrier.

9. The structure of claim 7 wherein said bonding is flip chip bonding.

10. The structure of claim 4 wherein said first component is a chip carrier package.

11. The structure of claim 4 in which said second component is a circuit board.

12. A method of joining two microelectric components comprising the steps of, providing first and second electronic components to be joined, and connecting said components with a solder consisting essentially of from about 80–81% tin, from about 2.0–4.0% silver, from about 5–6% indium and from about 10–12% bismuth by weight.

13. The method of claim 12 wherein the solder has a composition of about 80.0% tin, about 3.3% silver, about 5.5% indium and about 11.2% bismuth.

14. The method of claim 12 wherein the solder has a composition of about 80.8% tin, about 2.5% silver, about 5.5% indium and about 11.2% bismuth.

15. A paste comprising a flux, an organic vehicle, and metal particles, the particles consisting essentially of about 80–81% Sn, about 2–4% Ag, about 5–6% In and about 10–12% Bi by weight of metal.

16. A process for producing circuit boards, comprising:
producing plated through holes in a circuit board;
inserting the pins of pin-in-hole components into the plated through holes;
producing a stationary wave of liquid solder consisting essentially of about 80–81% Sn, about 2–4% Ag, about 5–6% In, and about 10–12% Bi by weight;
moving the circuit board across the wave with the bottom of the circuit board in contact with the wave, thereby substantially filling the plated through holes with solder; and
cooling the circuit board to form solid solder joints.

17. A process for producing circuit boards, comprising:
producing substrates with exposed metal pads on a surface;
depositing a solder paste consisting essentially of about 80–81% Sn, about 2–4% Ag, about 10–12% Bi and about 5–6% In by metal weight;
placing terminals of a surface mount component onto corresponding pads of the substrate;
heating to a temperature sufficient to reflow the solder paste to connect the component with the substrate; and
cooling to solidify the connections.

* * * * *